US008928980B2

(12) United States Patent
Weissenrieder et al.

(10) Patent No.: US 8,928,980 B2
(45) Date of Patent: Jan. 6, 2015

(54) MICROMIRROR ARRANGEMENT HAVING A COATING AND METHOD FOR THE PRODUCTION THEREOF

(75) Inventors: Karl-Stefan Weissenrieder, Elchingen (DE); Roland Loercher, Aalen-Hofherrnweiler (DE); Alexandra Pazidis, Essingen-Lautenburg (DE)

(73) Assignee: Carl Zeiss SMT GmbH, Oberkochen (DE)

(*) Notice: Subject to any disclaimer, the term of this patent is extended or adjusted under 35 U.S.C. 154(b) by 9 days.

(21) Appl. No.: 13/350,719

(22) Filed: Jan. 13, 2012

(65) Prior Publication Data

US 2012/0182606 A1 Jul. 19, 2012

Related U.S. Application Data

(63) Continuation of application No. PCT/EP2010/054426, filed on Apr. 1, 2010.

(30) Foreign Application Priority Data

Jul. 15, 2009 (DE) .................. 10 2009 033 511
Aug. 20, 2009 (DE) .................. 10 2009 038 000

(51) Int. Cl.
*G02B 1/10* (2006.01)
*G03F 7/20* (2006.01)

(52) U.S. Cl.
CPC ........ *G03F 7/70958* (2013.01); *G03F 7/70291* (2013.01)
USPC ............ 359/588; 359/359; 359/584; 359/582

(58) Field of Classification Search
USPC .................. 359/350, 359, 361, 577, 580, 582, 359/584–590, 601–605, 608, 613, 614, 850, 359/855, 884, 885, 890, 198.1–199.4, 359/200.6–200.8, 202.1, 221.2, 359/223.1–225.1, 226.2, 904, 290–295, 359/838, 846, 871, 872; 250/204, 559.06, 250/559.29, 230, 234; 347/255–260; 353/39, 98–99; 385/15–18, 22; 398/12, 398/19, 45
See application file for complete search history.

(56) References Cited

U.S. PATENT DOCUMENTS 5,572,543 A    11/1996  Heinemann et al.
5,850,309 A *  12/1998  Shirai et al. ................... 359/360
(Continued)

FOREIGN PATENT DOCUMENTS

DE    19851967 A1    5/2000
DE    10227367 A1    1/2004
(Continued)

OTHER PUBLICATIONS

L. Asinovsky et al., "Characterization of the optical properties of PECVD SiNx films using ellipsometry and reflectrometry.", Thin Solid Films 313-314 (1998) 198-204.

(Continued)

*Primary Examiner* — Stephone B Allen
*Assistant Examiner* — James McGee
(74) *Attorney, Agent, or Firm* — Edell, Shapiro & Finnan, LLC

(57) ABSTRACT

A micromirror arrangement (1) having: at least one micromirror (3) having a reflective surface (11) formed at a mirror substrate (2), and an antireflective coating (7) formed at the mirror substrate (2) outside the reflective surface (11). A reflective coating (8) is formed within the reflective surface (11) and has at least two layer subsystems, wherein the first layer subsystem has layers (8e, 8f) composed of a periodic sequence of alternate high and low refractive index layers composed of a nonmetallic material and is optimized with regard to the reflectivity in respect of a used wavelength of the micromirror arrangement, and wherein the second layer subsystem is optimized with regard to the reflectivity in respect of a measurement wavelength of the micromirror arrangement, said measurement wavelength deviating from the used wavelength.

12 Claims, 8 Drawing Sheets

(56) References Cited

U.S. PATENT DOCUMENTS

| | | |
|---|---|---|
| 6,319,568 B1 | 11/2001 | Dai et al. |
| 6,778,315 B2 | 8/2004 | Guo et al. |
| 6,891,655 B2 | 5/2005 | Grebinski et al. |
| 2003/0092258 A1 | 5/2003 | Leng |
| 2004/0190281 A1 | 9/2004 | Williams et al. |
| 2006/0154552 A1 | 7/2006 | Chen |
| 2006/0245036 A1 | 11/2006 | Neidrich |
| 2007/0109676 A1 | 5/2007 | Iida et al. |
| 2008/0074727 A1 | 3/2008 | Sohn et al. |
| 2008/0285112 A1 | 11/2008 | Ishii et al. |
| 2009/0001272 A1* | 1/2009 | Hajjar ................ 250/354.1 |
| 2009/0161223 A1 | 6/2009 | Ichikawa et al. |
| 2011/0080572 A1 | 4/2011 | Kelkar |

FOREIGN PATENT DOCUMENTS

| | | |
|---|---|---|
| DE | 10248707 A1 | 5/2004 |
| JP | 2010102337 A | 5/2010 |
| WO | 9809289 A1 | 3/1998 |
| WO | 2006000445 A1 | 1/2006 |

OTHER PUBLICATIONS

J.N. Hilfiker et al., "Optical characterization in the vacuum ultraviolet with Variable Angle Spectroscopic Ellipsometry: 157 nm and below", SPIE Microlithography 2000 Conference, Mar. 1, 2000.

Office Action in related Japanese Application No. 2012-519940, dated Dec. 16, 2013, along with an English translation.

* cited by examiner

MICROMIRROR ARRANGEMENT HAVING A COATING AND METHOD FOR THE PRODUCTION THEREOF

CROSS REFERENCE TO RELATED APPLICATIONS

This is a Continuation of International Application PCT/EP2010/054426, with an international filing date of Apr. 1, 2010, which was published under PCT Article 21(2) in German, and which claims priority under 35 U.S.C. §119(a) to German Patent Application No. 10 2009 033 511.0, filed on Jul. 15, 2009, and to German Patent Application No. 10 2009 038 000.0, filed on Aug. 20, 2009. The entire contents of each of these applications are hereby incorporated by reference.

FIELD OF AND BACKGROUND OF THE INVENTION

The invention relates to a micromirror arrangement, comprising: at least one micromirror having a reflective surface formed at a mirror substrate, and an antireflection coating formed at the mirror substrate outside the reflective surface. The invention also relates to a method for producing a coating for a micromirror arrangement.

Micromirror arrangements have a plurality of micromirrors which are arranged alongside one another in an areal, generally matrix-type arrangement and can be moved independently of one another. The optical surface of an individual micromirror is typically mounted such that it is movable, in particular tiltable, relative to a plane common to all the micromirrors. In order to produce the movement or tilting, electrodes can be fitted under the micromirror, which electrodes electrostatically attract the mirror substrate. As a result of the tilting of the individual micromirrors, the latter can reflect the incident radiation in different spatial directions in a targeted manner and thus be used e.g. for pupil shaping in illumination systems for microlithography.

It is known that the micromirror arrangements can be provided with reflective coatings in order to increase the reflectivity of such a micromirror arrangement at a used wavelength relative to the natural reflectivity of the substrate material of the micromirror arrangement. In general, such coatings for micromirror arrangements consist of dielectrically reinforced metal layers, see U.S. Pat. No. 7,307,775, U.S. Pat. No. 6,816,302, U.S. Pat. No. 6,778,315, U.S. Pat. No. 6,891,655, WO 2006000445, U.S. Pat. No. 5,572,543 and U.S. Pat. No. 6,746,886.

What is disadvantageous about these layers, however, is that these coatings degrade under intensive irradiation and over time have so-called "hillocks", these being small elevations on the surface having a generally circular cross section, and also an increased roughness, which leads to increased stray light of these layers. Furthermore, what is disadvantageous about these layers is that they are not simultaneously suitable for light having a different wavelength which is incident at large angles of incidence with respect to the normal to the mirror surface. Such light having a measurement wavelength deviating from the used wavelength is required for calibration purposes for micromirror arrangements in an illumination system for microlithography.

Since, owing to the dictates of structural engineering, the reflective surfaces of the micromirrors generally cannot be arranged directly adjacent to one another, the radiation incident on the micromirror arrangement impinges on not only the reflective surfaces of the individual micromirrors but also regions in which no reflection of the radiation is desired. That region of the micromirror arrangement which is exposed to the incident radiation outside the reflective surfaces should reflect or backscatter as little radiation as possible since said radiation, for example when the micromirror arrangement is used for pupil shaping, is reflected directly into the region of the pupil as extraneous light.

U.S. Pat. No. 6,891,655 B2 discloses a micromirror arrangement and a method for producing the latter, wherein the resistance of a micromirror to radiation in the UV wavelength range is intended to be increased by applying a radiation-resistant layer. Said document furthermore proposes applying an antireflection coating to the rear side of the micromirror and/or to an immobile substrate on which the micromirror is mounted. Inter alia, magnesium fluoride and calcium fluoride are proposed as materials for the layers of the antireflection coating.

In order to reduce the reflectivity of the micromirror arrangement outside the optical surfaces, it is also possible to provide a diaphragm that collects the incident radiation. What is disadvantageous about this solution, however, is the low mechanical stability thereof, and the possibly inadequate accuracy during the fixing or alignment thereof.

OBJECTS AND SUMMARY OF THE INVENTION

It is an object of the invention to specify a micromirror arrangement and a method for producing a coating, wherein the coating does not degrade under intensive irradiation by light having the used wavelength and is simultaneously suitable for light having a different wavelength than the used wavelength. Furthermore, the coating is intended to reflect as little light as possible outside the reflective surface of a micromirror, in order to avoid extraneous light.

This object is achieved according to one formulation of the invention by virtue of the fact that the micromirror arrangement comprises at least one micromirror having a reflective surface formed at a mirror substrate, wherein a reflective coating is formed at the mirror substrate within the reflective surface, wherein an antireflection coating formed at the mirror substrate outside the reflective surface has at least one absorbent layer composed of a preferably nonmetallic material having an absorption coefficient of 0.1 or more, preferably of 0.2 or more, in particular of 0.4 or more, at a wavelength in the UV range, in particular at 193 nm. The use of a reflective coating within the reflective surface and an antireflection coating outside the reflective surface of the micromirror makes it possible, on the one hand, to provide the desired reflectivity properties and, on the other hand, to suppress the undesired extraneous light.

In one embodiment, the antireflection coating of the micromirror arrangement has a reflectivity of 10% or less, preferably of 5% or less, at normal incidence in a wavelength range of between 185 nm and 210 nm, in particular up to 230 nm. This makes it possible, in particular, to use such a micromirror arrangement for microlithography at a wavelength of 193 nm, since the extraneous light is sufficiently suppressed by the antireflection coating.

Furthermore, the object is achieved according to a further formulation of the invention by virtue of the fact that the micromirror arrangement comprises at least one micromirror having a reflective surface formed at a mirror substrate, wherein a reflective coating is formed at the mirror substrate within the reflective surface, said reflective coating having at least two layer subsystems. In this case, the first layer subsystem consists of a periodic sequence of alternate high and low refractive index layers composed of a nonmetallic material and is optimized with regard to the reflectivity in respect of a used wavelength of the micromirror arrangement. Furthermore, the second layer subsystem of the reflective coating is optimized with regard to the reflectivity in respect of a measurement wavelength of the micromirror arrangement, said measurement wavelength deviating from the used wavelength. In one embodiment, the mirror substrate consists of silicon and the reflective coating is embodied as a patterned coating in such a way that the reflective coating is delimited to the area of the reflective surface of the micromirror.

In the context of this application, a high refractive index layer is understood to be a layer composed of a material which, at the used or measurement wavelength, refracts the corresponding light to a greater extent compared with the material of the other layer of the associated period. Conversely, for a low refractive index layer it holds true that the material of this layer refracts the corresponding light to a lesser extent in a comparison with the material of the other layer of the associated period.

In the context of this application, used wavelength of a micromirror arrangement is understood to be the wavelength of the used light to which the micromirror arrangement is exposed during the intended use. In the case of microlithography, this is the used wavelength of 193 nm or 248 nm.

The measurement wavelength is a wavelength of the measurement light that deviates from the used wavelength by at least 50 nm, the micromirror arrangement being calibrated during operation with the aid of said measurement light. In the case of microlithography, the measurement wavelength is advantageously in the visible or infrared spectral range.

In the context of this application, the reflectivity of a surface or of a coating is specified as the ratio of the intensity of the reflected radiation to the intensity of the incident radiation in the unit [%].

By using at least two layer subsystems for the reflective coating of a micromirror arrangement, the latter can be simultaneously optimized, both with regard to the used wavelength and with regard to an additional measurement wavelength, to the respective objective on which the corresponding layer subsystem is based, through the particular design of said layer subsystem. Furthermore, by avoiding metal layers in the first layer subsystem, it is possible to avoid, as has been recognized by the inventors, the situation where the first layer subsystem degrades over time in the case of intensive irradiation. In this case, it is advantageous if the first layer subsystem follows the second layer subsystem in the direction of the surface normal as seen from the substrate, since then the used light is substantially reflected by the first layer subsystem and, consequently, is substantially not influenced by the second layer subsystem situated underneath.

In one embodiment, the reflective coating has at least one separating layer between the two layer subsystems, wherein the material of the separating layer is a material preferably selected from the group comprising: $TiO_2$, $Ta_2O_5$, $HfO_2$, $ZrO_2$, Si, Ge, ZnS, $CuInSe_2$, $CuInS_2$, $La_2O_3$. Said separating layer is substantially non-transmissive to the light having the used wavelength and at least partly transmissive to the light having the measurement wavelength. Consequently, the two layer subsystems can be decoupled in respect of the reflectivity properties also for the case where the layer subsystems consist of a small number of layers which do not completely reflect the light.

Advantageously, the separating layer consists of a material whose band edge lies between the used wavelength and the measurement wavelength.

In a further embodiment, the layers of the first layer subsystem consist of materials selected from the group comprising: $LaF_3$, $MgF_2$, $SiO_2$, $Al_2O_3$, $ErF_3$, $GdF_3$, $HfO_2$, $AlF_3$. As a result, it is possible to realize particularly high reflectivity values in conjunction with a small number of layers at the used wavelength in the first layer subsystem.

In one embodiment, the layers of the second layer subsystem consist of materials selected from the group comprising: $La_2O_3$, $ZrO_2$, $TiO_2$, $Ta_2O_5$, $MgF_2$, $SiO_2$, $Al_2O_3$, Si, Ge, $HfO_2$, $AlF_3$. As a result, it is possible to realize high reflectivity values of the reflective coating in particular for light in the visible or infrared wavelength range.

In a further embodiment, the at least one micromirror of the micromirror arrangement has an antireflection coating having at least one absorbent layer composed of a nonmetallic material having an absorption coefficient (imaginary part of the refractive index) of 0.1 or more, preferably of 0.2 or more, in particular of 0.4 or more, at a wavelength in the UV range, in particular at 193 nm.

In one embodiment, the antireflection coating is arranged adjacent to the reflective surfaces on the mirror substrate and should cover as far as possible the entire area outside the reflective surfaces, which in general can only be achieved if the antireflection coating is patterned, wherein the tolerances during the patterning of the antireflection coating should turn out to be as small as possible. Photolithography is particularly well suited as a method for patterning the antireflection coating with low tolerances. In one embodiment, the mirror substrate in this case consists of silicon.

In one embodiment, the material of the absorbent layer is a compound selected from the group comprising: $TiO_2$, $Ta_2O_3$, $Ta_2O_5$, $HfO_2$, $ZrO_2$, chromium oxides ($Cr_xO_y$), $PbF_2$, $YF_3$, C, diamond-like carbon, Ge, Si, SiN, silicon nitrides ($Si_xN_y$), silicon oxide nitrides ($SiN_xO_y$) and non-stoichiometric silicon oxides ($Si_xO_y$). This involves materials which can be applied as thin layers in standardized processes, to be precise in particular by plasma-enhanced chemical vapor deposition (PECVD), by thermal evaporation or by sputtering.

Furthermore, in one embodiment wherein the reflective coating is applied on the antireflection coating, the layer stress of the antireflection coating, using the materials mentioned, can be used for compensating for the layer stress of the reflective coating. In this case, the total stress of the coating comprising the reflective coating and the antireflection coating should not exceed a value of 100 N/m, if possible even 30 N/m, in order to avoid a deformation of the micromirror.

The layer materials mentioned are also etchable substantially selectively with respect to the silicon substrate, that is to say that in general a negligible change in the thickness of the silicon occurs during the etching-away process, in particular during the wet-chemical etching-away process. The absorption coefficient (imaginary part of the refractive index) of the materials described above can vary depending on the manner of application and, e.g. in the case of SiN for a wavelength of 193 nm, can be in a range of between 0.17 and 0.3 or else higher, up to approximately 0.7; for details in this respect cf. U.S. Pat. No. 6,319,568 B1, which, with regard to this aspect, is incorporated by reference in the content of this application.

In a further embodiment, at least one further layer having a lower refractive index than the refractive index of the absorbent layer is applied to the absorbent layer. The further layer serves for avoiding or reducing reflections when the incident radiation is coupled into the absorbent layer, and consists of a material which is transparent to the incident radiation and which has a comparatively low absorption coefficient, which can be e.g. less than 0.001. It is also possible to use transparent layers having higher absorption coefficients, e.g. 0.015 or more. Moreover, the antireflection coating can have a plurality of layer pairs arranged one above another and each consisting of an absorbent layer and a transparent layer.

In one embodiment, the further layer consists of $MgF_2$, $LaF_3$, chiolite, cryolite, $Al_2O_3$, $ErF_3$ or a silicon-oxygen compound, in particular silicon dioxide ($SiO_2$). At a wavelength of 193 nm, silicon dioxide has an absorption coefficient of approximately 0.0002 or more, which can likewise vary depending on the coating conditions. At a used wavelength of 248 nm $HfO_2$ can equally be used as a further transparent layer. In this case, $HfO_2$ then cannot function as an absorbent layer.

In a further embodiment, all the layers of the antireflection coating consist of nonmetallic materials, in particular of silicon compounds. In this case, the entire antireflection coating can be applied in a single coating apparatus through a suitable choice of the reactive gas components.

In a further embodiment, the thickness of the at least one absorbent layer is chosen such that the radiation impinging on the absorbent layer is completely absorbed. The inventors have recognized that, when a mirror substrate composed of silicon is used, a thin layer of silicon oxide ($SiO_2$) can form at the surface of the mirror substrate, the thickness of said layer typically varying between approximately 0 nm and approximately 7 nm. This silicon oxide layer should concomitantly be taken into account when calculating the layer design of the antireflection coating, but in general this is possible only with difficulty owing to its variable thickness. Therefore, it is proposed to choose the thickness of the absorbent layer to be large enough that radiation no longer impinges on the mirror substrate or the silicon oxide layer. In this way, the calculation of the design is independent of the silicon oxide layer and there are defined conditions for the calculation of the layer thicknesses of the further layers following the absorbent layer.

In one embodiment, the thickness of the at least one absorbent layer is between 40 nm and 100 nm, in particular between 60 nm and 80 nm. In the case of the power densities used for the micromirror arrangement and the silicon-nitrogen compounds typically used for the absorbent layer, an absorbent layer having such a thickness generally suffices for completely absorbing the incident radiation.

In a further embodiment, the antireflection coating has a reflectivity of 5% or less, preferably of 3% or less, in particular of 1% or less, at a used wavelength of 193 nm, or at a used wavelength of 248 nm, with normal incidence. This is a significant reduction in the reflectivity by comparison with a mirror substrate composed of silicon, for example, which has a reflectivity of approximately 65% at a wavelength of 193 nm.

In one embodiment, the reflective coating, in particular the first layer subsystem, has a reflectivity of more than 65%, preferably more than 80%, in particular of more than 95%, at a used wavelength of 193 nm, or at a used wavelength of 248 nm, at an angle of incidence of between 0° and 25° with respect to the normal to the reflective surface. Such a high reflectivity can compensate for the disadvantage that the entire area of a micromirror arrangement does not reflect the light, for the use of such a micromirror arrangement within an illumination system for microlithography.

In a further embodiment, the reflective coating, in particular the second layer subsystem, is designed in such a way that a reflectivity of more than 65%, in particular of more than 85%, results at a measurement wavelength deviating from the used wavelength, at an angle of incidence with respect to the normal to the reflective surface, wherein the angle of incidence deviates by more than 15°, in particular by more than 20°, from an angle of incidence of the used light, and wherein the angles of incidence of the used light are predetermined by the intended use of the micromirror arrangement. This makes it possible for the beam paths and optical units required for calibration to be led along other, in particular inclined, beam paths relative to the micromirror arrangement, such that the optical units for calibration and the remaining optical units of the illumination system do not influence one another in terms of engineering from the standpoint of structural space.

In a further embodiment, the antireflection coating has a reflectivity of 10% or less, preferably of 5% or less, at normal incidence in a wavelength range of between 185 nm and 210 nm, in particular up to 230 nm. Such a broadband antireflective coating effect can be achieved by the thicknesses of the absorbent layer and of the further layers being suitably coordinated with one another. Conventional layer design programs can be used for optimizing the layer thicknesses in the case of known refractive indices of the layer materials used. Advantages of a broadband antireflective coating effect are higher manufacturing tolerances and the coverage of a wider range of angles of incidence for a selected wavelength.

In one embodiment, the reflective coating is firstly applied areally to the antireflective coating and subsequently patterned by lithographic methods by removing the reflective coating in predetermined regions as far as the antireflection coating in a targeted manner. Alternatively or additionally, it is possible for the reflective coating to be at least partly applied directly to the mirror substrate, e.g. if the antireflection coating has already been patterned such that no antireflection coating is present in the regions in which the optical surfaces are intended to be formed.

In a further embodiment, the micromirror arrangement comprises a supporting structure, on which the at least one micromirror is mounted in movable fashion. The movable mounting of the generally plate-shaped micromirror on the generally column-shaped supporting structure can be effected e.g. with a hinge or with a spring. In this case, the micromirror is deflected typically by the electrostatic attraction of the mirror substrate with the aid of electrodes arranged under the micromirror.

In one embodiment, the micromirror arrangement has at least one adhesion promoting layer serving for promoting the adhesion of the reflective coating on the antireflection coating or for promoting the adhesion of the antireflection coating on the substrate. This prevents the layers from undesirably becoming chipped off from the substrate. Chipped-off layers impair not only the affected micromirror itself, but can also jam adjacent micromirrors.

A further aspect of the invention is realized in a method of the type mentioned in the introduction, comprising: coating a mirror substrate with the antireflection coating, and patterning the antireflection coating by applying a material layer that can be patterned by irradiation to the antireflection coating and/or to the mirror substrate. In one embodiment, the mirror substrate in this case consists of silicon.

The invention proposes patterning the antireflection coating with the aid of a lithographic method, i.e. by applying a radiation-sensitive material layer which can be patterned by irradiation. In this case, the material layer can be applied to the antireflection coating or directly to the mirror substrate, wherein it serves as an etching mask in the former case and as a sacrificial layer or etching stop in the latter case. In any case, the radiation-sensitive material layer is removed after or during the patterning of the antireflection coating, such that the antireflection coating can firstly be applied areally and subsequently be removed in a targeted manner in the regions in which no antireflection coating is desired.

In one variant, the mirror substrate is coated with at least one absorbent layer composed of a nonmetallic material having an absorption coefficient of 0.1 or more, preferably of 0.2 or more, in particular of 0.4 or more, at a wavelength in the UV range, in particular at 193 nm, such that the number of layers and thus the number of coating processes can be significantly reduced by comparison with an antireflection coating composed of a customary multilayer system consisting of transparent materials.

In a further variant, as material of the absorbent layer a compound is selected from the group comprising: $TiO_2$, $Ta_2O_3$, $Ta_2O_5$, $HfO_2$, $ZrO_2$, chromium oxides ($Cr_xO_y$), $PbF_2$, $YF_3$, C, diamond-like carbon, Ge, Si, SiN, silicon nitrides ($Si_xN_y$), silicon oxide nitrides ($SiN_xO_y$) and non-stoichiometric silicon oxides ($Si_xO_y$). These compounds all have high absorption values at the used wavelength of 193 nm.

In a further variant, at least one further layer having a lower refractive index than the refractive index of the absorbent layer is applied to the absorbent layer in order to couple the radiation into the absorbent layer, i.e. to antireflectively coat the absorbent layer. A layer having a higher refractive index can also follow the further layer.

In one variant, said further layer consists of $HfO_2$, $MgF_2$, $LaF_3$, chiolite, cryolite, $Al_2O_3$, $ErF_3$ or a silicon-oxygen compound, in particular silicon dioxide ($SiO_2$).

One variant of the method comprises applying a reflective coating to the antireflection coating and/or to the mirror substrate in order to produce at least one reflective surface at a micromirror. In this case, the reflective coating consists of a reflective multilayer system according to the invention, comprising a first and a second layer subsystem, wherein the first layer subsystem consists of alternate high and low refractive index, transparent layers.

In a further variant, the reflective coating is firstly applied areally and subsequently removed selectively from the antireflection coating outside the reflective surface, wherein in this case, too, a radiation-sensitive material layer that can be patterned can be applied to the reflective coating as an etching mask in the region of the reflective surface and/or can be applied to the antireflection coating as a sacrificial layer or as an etching stop outside the reflective surface.

In a further variant, the layer stress of the antireflection coating is coordinated with the layer stress of the reflective coating such that the two layer stresses substantially compensate for one another, i.e. an e.g. negative layer stress of the antireflection coating can be compensated for by a positive layer stress of the reflective coating having a substantially identical absolute value, and vice versa. Compensating "substantially" is understood to mean that the deviation of the absolute value of the layer stresses of the two coatings is approximately 20% or less.

In one variant, the antireflection coating is firstly applied to the mirror substrate areally and subsequently removed selectively from the mirror substrate in the region of the reflective surface. In this way, the reflective coating can be applied directly to the mirror substrate in the region of the reflective surface, such that the mirror substrate, which per se (e.g. in the case of silicon) already has a high reflectivity for the incident radiation, only has to be supplemented by a small number of reflective layers in order to obtain the desired high reflectivity for the incident radiation in the region of the reflective surface.

In a further variant, at least one, preferably each, layer of the antireflection coating is applied by plasma-enhanced chemical vapor deposition. Particularly when exclusively using silicon compounds as materials for the layers of the antireflection coating, it is possible to apply the antireflection coating in a coating apparatus in a single coating process by suitably varying the reactive gas components.

In one variant, the reflective coating has at least two layer subsystems, wherein the first layer subsystem has layers composed of a periodic sequence of alternate high and low refractive index layers composed of a nonmetallic material and is optimized with regard to the reflectivity in respect of a used wavelength of the micromirror arrangement, and wherein the second layer subsystem is optimized with regard to the reflectivity in respect of a measurement wavelength of the micromirror arrangement, said measurement wavelength deviating from the used wavelength, wherein the reflective coating has at least one separating layer between the two layer subsystems and the material of the separating layer is a material selected from the group comprising: $TiO_2$, $Ta_2O_5$, $HfO_2$, $ZrO_2$, Si, Ge, ZnS, $CuInSe_2$, $CuInS_2$, $La_2O_3$, wherein the materials of the layers of the first layer subsystem are materials selected from the group comprising: $LaF_3$, $MgF_2$, $SiO_2$, $Al_2O_3$, $ErF_3$, $GdF_3$, $HfO_2$, $AlF_3$, and wherein the materials of the layers of the second layer subsystem are materials selected from the group comprising: $La_2O_3$, $ZrO_2$, $TiO_2$, $Ta_2O_5$, $MgF_2$, $SiO_2$, $Al_2O_3$, Si, Ge, $HfO_2$, $AlF_3$.

Further features and advantages of the invention are evident from the following description of exemplary embodiments of the invention, with reference to the figures, which show details essential to the invention, and from the claims. The individual features can be realized in each case individually by themselves or as a plurality in any desired combination in a variant of the invention.

BRIEF DESCRIPTION OF THE DRAWINGS

Exemplary embodiments are illustrated in the schematic figures and are explained in the following description. In the figures:

FIG. 11 shows a schematic illustration of the layer construction of the exemplary embodiments with respect to the coating of the micromirror arrangement from FIG. 1a.

DETAILED DESCRIPTION

Figure 1A:
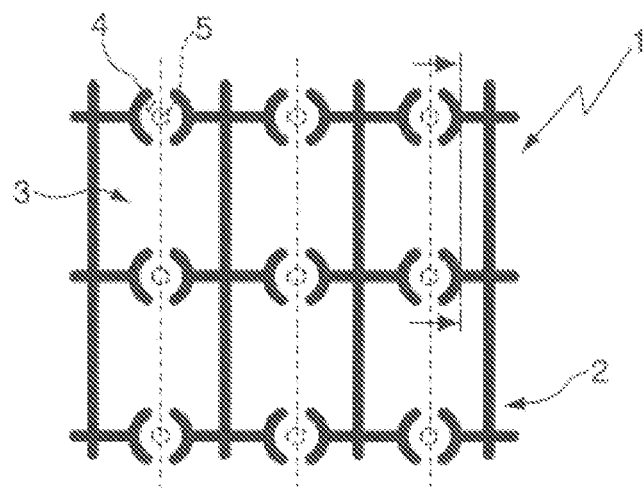
FIG. 1a shows a schematic illustration of a micromirror arrangement according to the invention in a plan view.

FIG. 1a schematically shows a micromirror arrangement 1, which has a plate-shaped mirror substrate 2, on which a plurality of micromirrors 3 are mounted in movable fashion between partial regions 4—serving as hinges—of the mirror substrate 2 with a reduced thickness on column-shaped supporting structures 5. A plurality of, typically three, electrodes (not shown) are fitted below the mirror substrate 2 in the region of each micromirror 3, which electrodes enable the micromirrors 3 to tilt relative to a respective axis which is indicated in a dashed fashion and which runs in the region of the supporting structures 5 through the mirror substrate 2. The micromirrors 3 can also be tilted about two e.g. mutually perpendicular axes if the arrangement or shaping of the hinges 4 is suitably modified, e.g. if the latter are arranged in the corner regions of the micromirrors 3.

In order to obtain the micromirror arrangement 1 shown in FIG. 1a, the planar mirror substrate 2 that is still unpatterned has applied to it an antireflection coating 7 and also a reflective coating 8, as will be explained in greater detail below with reference to FIGS. 2a-c, FIGS. 3a-c and FIGS. 4a-c, which show different variants of the coating process.

Figure 2A:
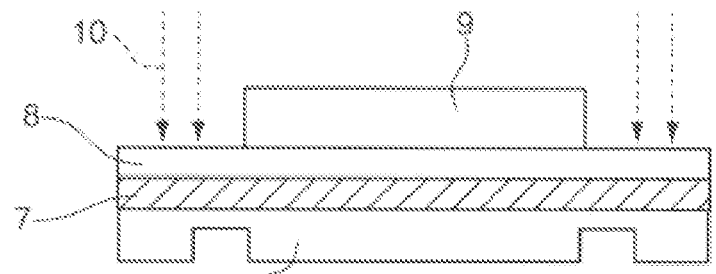
FIGS. 2a-c show a schematic illustration of a first variant of the coating of the micromirror arrangement from FIG. 1a with an antireflection coating and a reflective coating.

FIG. 2a illustrates a coating variant wherein the antireflective coating 7 is applied to the mirror substrate 2 and the reflective coating 8 is applied to said antireflection coating areally. A radiation-sensitive material layer 9, also called resist hereinafter, is applied to the reflective coating 8, which material layer, in a preceding step, was patterned by irradiation or exposure and subsequent development and was then removed in the unexposed regions. In this case, the material layer 9 can consist of the resist materials which are customary in microlithography and which can be selectively removed, such that the reflective coating 8 remains intact during the partial removal of the material layer 9.

Figure 2B:
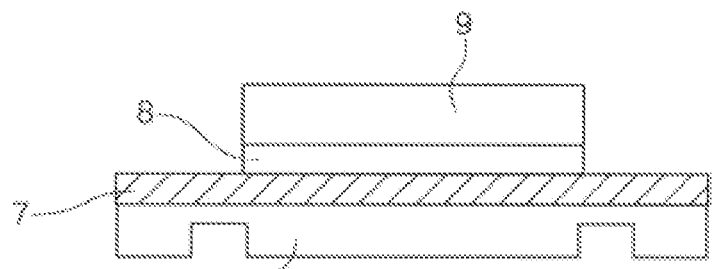
Figure 2C:
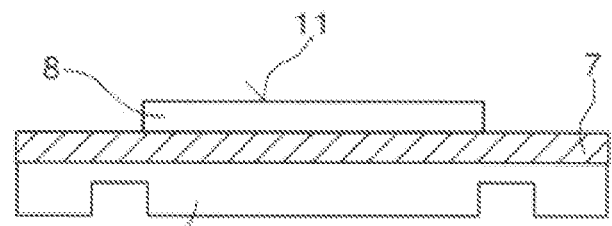

As is likewise shown in FIG. 2a, the reflective coating 8 is subsequently removed using an etching process selectively in the regions at which no patterned material layer 9 is present. In this case, the etching attack is indicated by dashed arrows 10 and can be carried out using dry or wet etching in a known manner. The etching results in complete removal of the reflective coating 8 in the regions not protected by the resist 9 as is illustrated in FIG. 2b, that is to say that the resist 9 serves as an etching mask for the patterning of the reflective coating 8. FIG. 2c illustrates the result of the coating after the resist 9 has been removed from the reflective coating 8, as a result of which a reflective surface 11 having the desired geometry is formed at the reflective coating 8.

Figure 3A:
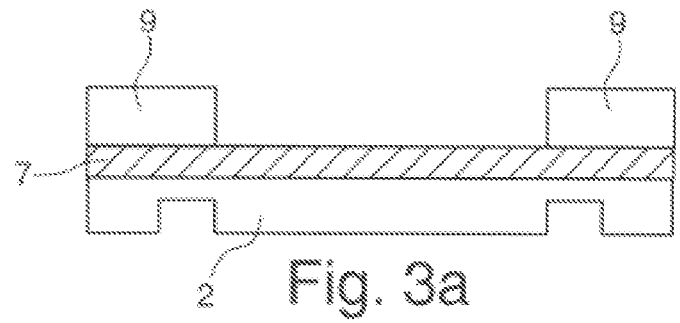
FIGS. 3a-c show a schematic illustration of a second variant of the coating of the micromirror arrangement from FIG. 1a, FIGS. 4a-c show a schematic illustration of a third variant of the coating of the micromirror arrangement from FIG. 1a, FIG. 5 shows an illustration of the reflectivity of a first variant of the antireflection coating as a function of the angle of incidence.
Figure 3B:
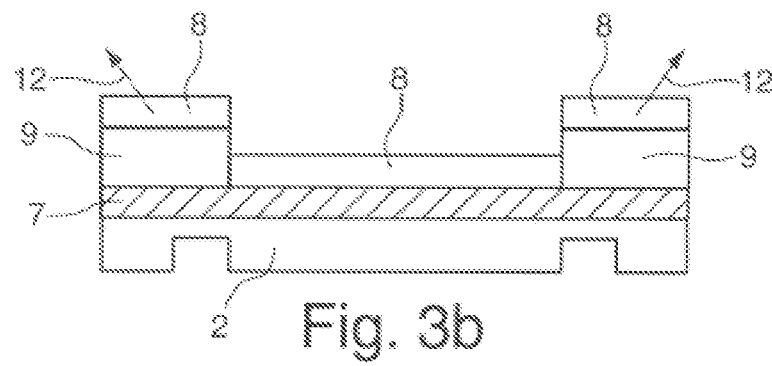
Figure 3C:
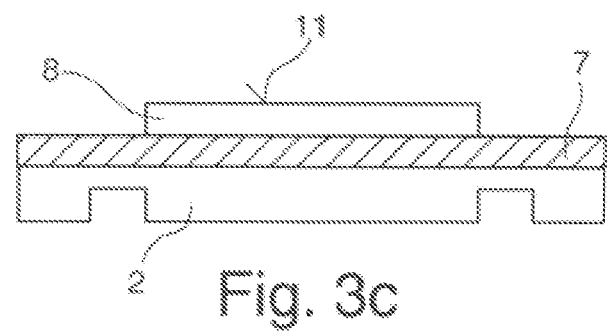

The coating process illustrated in FIGS. 3a-c differs from that shown in FIGS. 2a-c in that, before the reflective coating 8 is applied to the antireflection coating 7, firstly the resist 9 is applied and patterned, cf. FIG. 3a. In this case, the resist 9 serves as a sacrificial layer and, as is indicated by arrows 12 in FIG. 3b, can be lifted off from the antireflection coating 7 using suitable, likewise known methods after the reflective coating 8 has been applied to said antireflection coating. As shown in FIG. 3c, in this way likewise only the desired region of the reflective coating 8 having the reflective surface 11 remains on the antireflection coating 7.

Figure 4A:
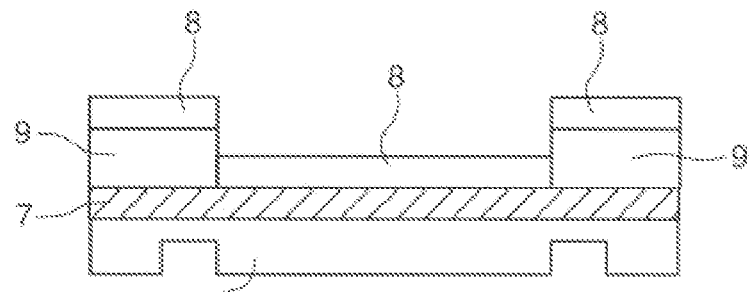
Figure 4B:
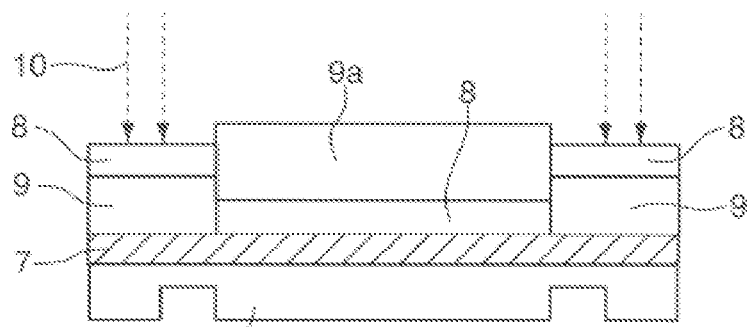
Figure 4C:
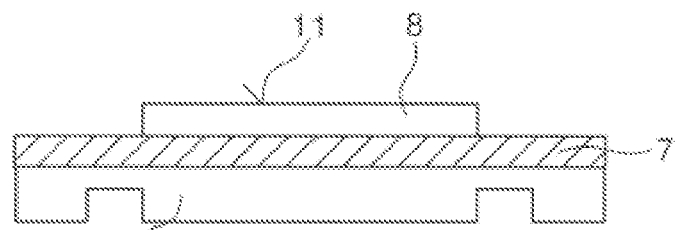

Finally, FIGS. 4a-c show a variant of the method wherein the coating steps from FIGS. 2a-c and FIGS. 3a-c are combined. The starting point in this case is the situation illustrated in FIG. 3b, in which the reflective coating 8 was applied to the patterned resist 9. In this case, however, a resist material was chosen which does not serve as a sacrificial layer, but rather as an etching stop for the antireflection coating 7 lying underneath. As illustrated in FIG. 4b, a further resist layer 9a as etching stop is applied to that partial region of the reflective coating 8 which was applied directly to the antireflection coating 7, and is patterned, such that that part of the reflective coating 9 which is not covered by the resist layer 9a can be removed in a subsequent etching step, as is illustrated by arrows 10 in FIG. 4b, wherein the etching is stopped at the resist 9. After the removal of the resist 9 and the resist layer 9a, the reflective surface 11 having the desired form is likewise obtained on the antireflection coating 7, as is shown in FIG. 4c.

The two variants shown in FIGS. 3a-c and FIGS. 4a-c are appropriate if the reflective coating 8 cannot be etched selectively with respect to the antireflection coating 7. In the coating variants described above, the individual layers can in each case be applied by customary thin-film coating methods, e.g. by plasma-enhanced chemical vapor deposition (PECVD), by thermal evaporation or by sputtering.

Besides the coating variants shown in FIGS. 2a-c to 4a-c, it is also possible firstly to pattern the antireflection coating 7 and to remove it in a targeted manner in the regions in which the reflective coating 8 or the optical surface 11 is intended to be formed. In this way, the reflective coating 8 can be applied directly to the mirror substrate 2, such that the high reflectivity thereof can be taken into account and used in the design of the reflective coating.

Figure 1B:
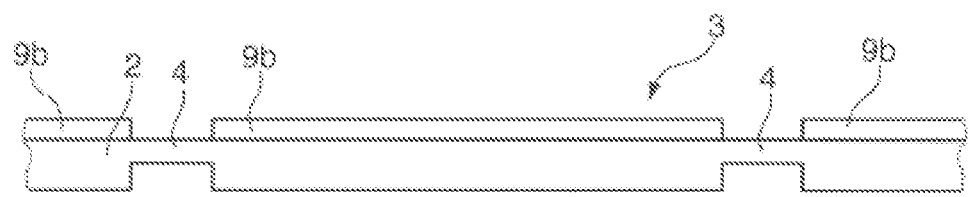
FIG. 1b shows the micromirror arrangement from FIG. 1a in a sectional illustration after coating and before patterning of the antireflection coating with a radiation-sensitive, patterned material layer.

In any case, a further resist layer 9b is subsequently applied to the substrate 3 areally, said further resist layer being patterned in the partial regions 4 serving as hinges, as illustrated in FIG. 1b, in which the illustration of the antireflection coating and the reflective coating has been dispensed with for the sake of better clarity. In this case, the illustration shown in FIG. 1b follows the sectional line shown in FIG. 1a before the patterning of the substrate 2. In a subsequent etching step, perforations are formed in the partial regions 4, as is shown in FIG. 1c, which illustrates the micromirror arrangement 1 along the sectional line from FIG. 1a in the end state after the removal of the resist layer 9b.

Figure 1C:
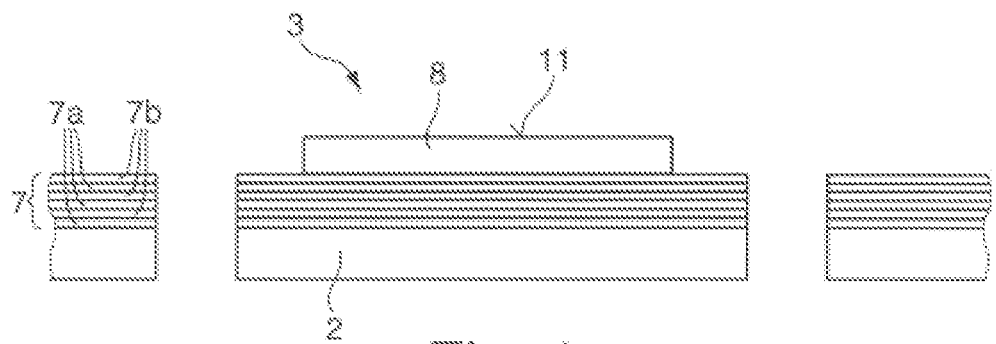
FIG. 1c shows the micromirror arrangement from FIG. 1b after patterning of the antireflection coating and after removal of the radiation-sensitive material layer.

FIG. 1c additionally shows the construction of the antireflection coating 7 more precisely: the latter has a first, absorbent layer 7a, to which a further layer 7b is applied, which serves for coupling the radiation (not shown) impinging on the antireflection coating 7 into the absorbent layer 7a and the refractive index of which is lower than that of the absorbent layer 7a. The first layer pair 7a, 7b is followed by another two further, identical layer pairs 7a, 7b. In the present case, the absorbent layer 7a consists of silicon nitride (SiN), which, depending on the process implementation chosen, has a real part of the refractive index n of between approximately 2.20 and 2.65 and an imaginary part k (absorption coefficient) of between 0.17 and 0.7 at a wavelength of 193 nm. In this case, the further layer 7b consists of $SiO_2$ having a refractive index n of between 1.56 and 1.70 and an absorption coefficient k of between 0.0002 and 0.015.

As can likewise be seen from FIG. 1c, approximately 50% of the area of the micromirror arrangement 1 is used for the targeted deflection of the incident radiation at the reflective surfaces 11. Outside the reflective surfaces 11, approximately 1% of the total intensity of the incident radiation still impinges, a maximum of 10% of which is permitted to be reflected if the micromirror arrangement 1 is intended to be used for pupil shaping, since, in this case, the radiation that is not reflected in a targeted manner passes directly into the pupil. Since the mirror substrate 2 composed of silicon has a reflectivity of approximately 65%, an antireflection coating 7 has to be designed such that the reflectivity is reduced by approximately 55-60%.

Figure 5:
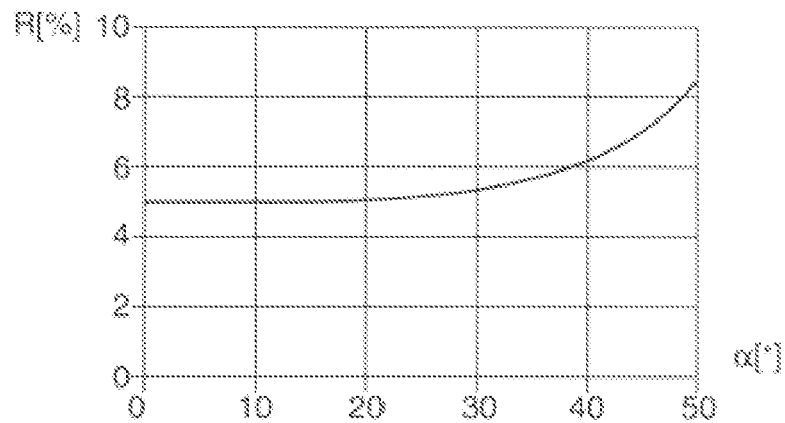

A typical layer design (six-layer embodiment) for the antireflection coating 7, having a reflectivity R of less than 10% even at high angles α of incidence of 50° or more, is shown in FIG. 5, wherein the layer thicknesses are given by: (Si substrate) 3×(2.9 nm H 1.95 nm L) (physical thickness in each case in nanometers) and the following data were taken as a basis for the individual layers:

|  |  | n | k |
|---|---|---|---|
| Silicon substrate: |  | 0.88 | 2.78 |
| SiN: | H | 2.5 | 0.3 |
| SiO$_2$: | L | 1.56 | 0.0002 |

By adapting the thicknesses of the layers 7a, 7b or the number of layers used, the reflectivity can be suitably adapted, in particular reduced further, wherein the comparatively high absorption (absorption coefficient greater than 0.1) of silicon nitride as absorbent layer material is favorable for antireflectively coating the non-transparent silicon. Other layer materials are also appropriate for the antireflection coating 7, e.g. silicon nitrides having a different composition (Si$_x$N$_y$) or silicon oxide nitrides (SiO$_x$N$_y$), wherein the number and order of the applied layers are dependent on the reflectivity to be obtained and the angle-of-incidence range at which the radiation is incident on the micromirror arrangement 1.

Given the exclusive use of the abovementioned silicon-containing materials for the layers of the antireflection coating 7, all layers can be applied in the same coating apparatus by suitably setting the reactive gas components in the apparatus. It is also possible to use layers composed of other materials, with which the desired reflectivity can be obtained, in the antireflection coating. In particular, if appropriate metals such as aluminum, chromium or titanium can also be used as absorbent layers. For the further layer 7b, too, it is possible to use materials other than silicon oxide (SiO$_2$) which are substantially transparent to the incident radiation and have a refractive index that is less than the refractive index of the absorbent layer 7a.

In the example described in connection with FIG. 5 for an antireflection coating, the layer thickness of the absorbent layer 7a is not large enough to completely absorb the incident radiation. Accordingly, the mirror substrate 2 has to be taken into account in the calculation of the layer design. In general, however, a thin layer of silicon oxide (a maximum of 7 nm) forms at the surface of the mirror substrate, wherein the thickness can be location-dependent and also varies depending on the process for producing the mirror substrate. Since the thickness of the oxide layer is generally not known exactly in the calculation of the design, it is difficult to produce a design having the desired properties. Therefore, it is advantageous to provide the reflective layer 7a of the antireflection coating with a thickness such that the incident radiation does not pass or passes only to a small extent as far as the mirror substrate 2 or as far as the oxidic layer, such that it remains insignificant for the antireflective coating effect. Depending on the target for the residual reflection, in the case of silicon nitride as absorbent layer the thickness required therefor is between a few 10 nm and above 100 nm. The required thickness is dependent on the absorption coefficient and therefore also on the process for producing the silicon nitride layer.

Figure 6:
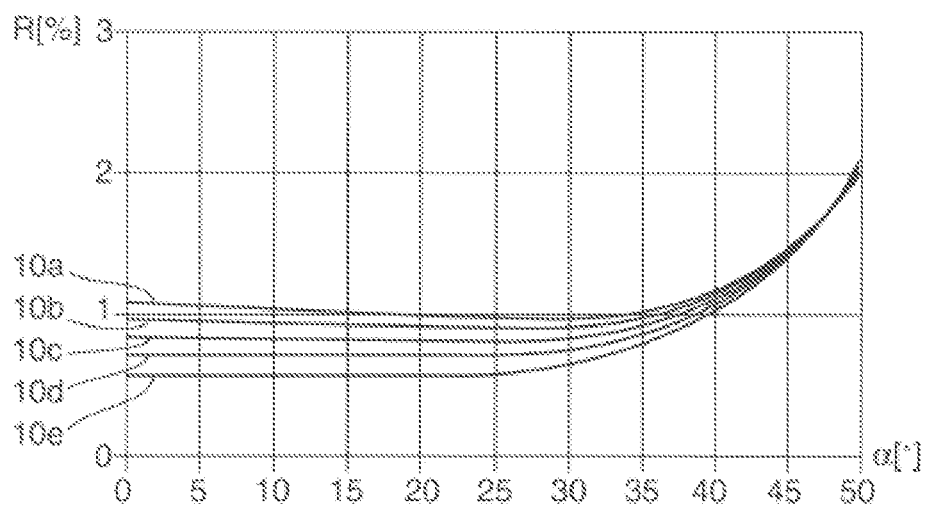
FIG. 6 shows an illustration of the reflectivity of a second variant of the antireflection coating as a function of the angle of incidence and of the thickness of a silicon oxide layer formed on the mirror substrate.

FIG. 6 shows an example of the reflectivity R of a layer design (two-layer embodiment) having a reflection of approximately ≤1% given normal incidence and a wavelength of 193 nm. The design has the following physical layer thicknesses: (Si substrate) (0 to 7 nm N) (97.9 nm H) (28.5 nm L).

The following data were taken as a basis for the individual layers:

| Refractive index | n | k |
|---|---|---|
| Substrate Si | 0.88 | 2.78 |
| N Nat. SiO$_2$ | 1.56 | 0.0002 |
| H PECVD SiN | 2.38 | 0.44 |
| L PECVD SiO$_2$ | 1.66 | 0.0005 |

The reflectivity curves 10a to 10e illustrated in FIG. 6 were determined in this case for the following thicknesses of the silicon oxide layer in the range of between 0 nm and 7 nm: curve 10a: 0 nm, 10b: 1 nm, 10c: 3 nm, 10d: 5 nm, 10e: 7 nm. As can clearly be discerned, the reflectivity R decreases as the layer thickness of the native SiO$_2$ layer increases, but the thickness of the absorbent layer 7a of approximately 100 nm is sufficient to achieve in all cases considered a reflectivity R which, given normal incidence, is in the range around approximately 1% or less. In the case of this design, therefore, in a departure from the case illustrated in FIG. 1c, a single layer pair 7a, 7b suffices for obtaining the desired reflectivity R.

In addition to achieving antireflective coating at an individual wavelength, e.g. at 193 nm, it is also possible to realize antireflective coating over a wavelength range of, for example, between 185 nm and 230 nm. In this case, the optical design or the layer thicknesses of the layers 7a, 7b and, if appropriate, of further layers has/have to be adapted accordingly. Commercially available layer design programs are typically used for optimizing the layer thicknesses given known refractive indices of the layer materials used. Advantages of a broadband antireflective coating effect are higher manufacturing tolerances and the coverage of a wider range of the angles of incidence for a selected wavelength.

In the case of the configuration illustrated in FIG. 1c, wherein the reflective coating 8 is applied to the antireflection coating 7, it is possible to coordinate the layer stress of the antireflection coating with the layer stress of the reflective coating such that the two layer stresses substantially compensate for one another, i.e. a resulting positive layer stress of one coating can be compensated for by a negative layer stress having a substantially identical absolute value (deviation a maximum of approximately 20%) of the other coating. In this case, it is possible to make use of the fact that the layer stresses of the individual layers, in particular of the absorbent layer 7a (e.g. composed of SiN), vary depending on the coating method chosen or the coating parameters chosen, with the result that the layer stress of the antireflection coating can be suitably adapted.

Figure 7:
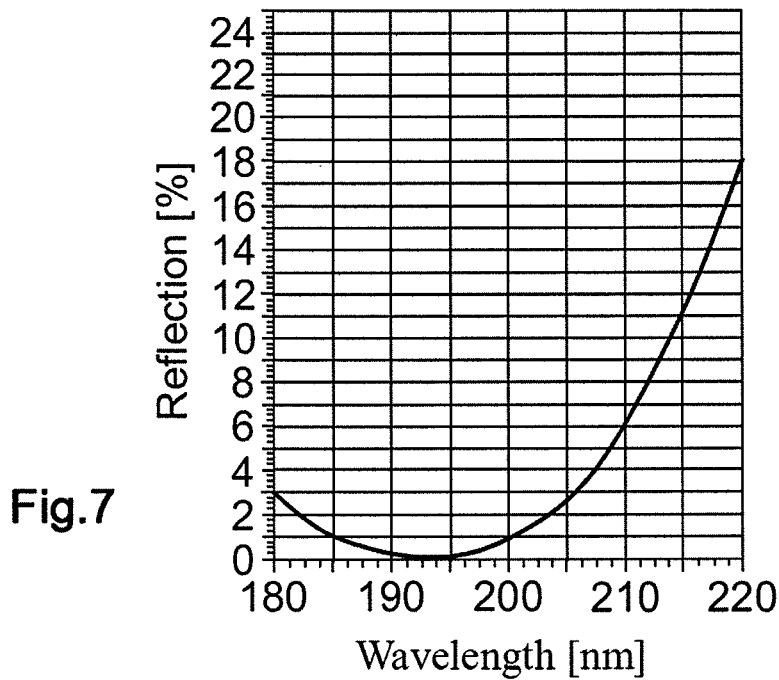
FIG. 7 shows an illustration of the reflectivity of a second exemplary embodiment with respect to the second variant of the antireflection coating as a function of the wavelength.

FIG. 7 shows the reflectivity of a second exemplary embodiment with respect to the second variant of the antireflection coating 7 in accordance with FIG. 6 as a function of the wavelength. The reflection of this antireflection coating 7 is less than 1% at the used wavelength of 193 nm with normal incidence of the used light of the micromirror arrangement. The design has the following physical layer thicknesses: (Si substrate) (90.2 nm H) (85.8 nm L).

In this case, the data in accordance with the exemplary embodiments concerning FIG. 6 were taken as a basis for the individual layers, wherein the coating of the exemplary embodiment concerning FIG. 7 is applied directly on the Si mirror substrate and is not separated from the latter by an $SiO_2$ layer. Consequently, the absorbent layer 7a consists of SiN and the further layer 7b, which is applied for coupling in the radiation impinging on the antireflection coating 7, consists of $SiO_2$.

It can be discerned with reference to FIG. 7 that the associated antireflection coating 7 is able to ensure, up to a used wavelength of 212 nm, that the reflectivity of the regions outside the reflective surfaces 11 of a micromirror arrangement remains below 10%.

Figure 8:
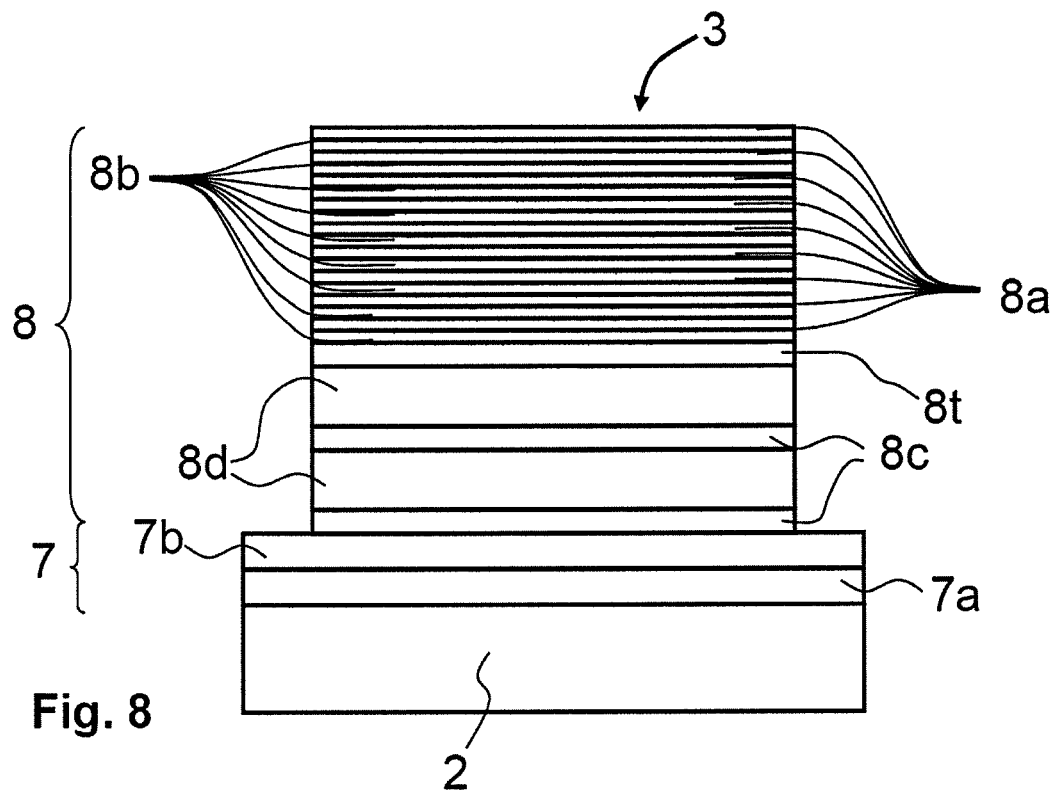
FIG. 8 shows a schematic illustration of the layer construction of an exemplary embodiment with respect to the coating of the micromirror arrangement from FIG. 1a, FIG. 9 shows an illustration of the reflectivity of the exemplary embodiment from FIG. 8 as a function of the used wavelength.

FIG. 8 is a schematic illustration of the layer construction of an exemplary embodiment with respect to the coating of a micromirror 3 of the micromirror arrangement from FIG. 1a, which, besides the antireflection coating 7 having the layers 7a and 7b on a substrate 2, also concomitantly comprises the reflective coating 8. In this case, the reflective coating 8 consists of two layer subsystems, wherein the first layer subsystem has layers 8a, 8b composed of a periodic sequence of alternate high and low refractive index layers composed of a nonmetallic material and is optimized with regard to reflectivity in respect of the used wavelength of 193 nm. The second layer subsystem consists of the high and low refractive index layers 8c, 8d and is optimized with regard to the reflectivity in respect of the measurement wavelength of 633 nm. The specific layer design for this exemplary embodiment can be specified as follows:

(Si substrate) (4.288 SiN)(2.783 $SiO_2$) 2×(1.796 $TiO_2$ 4.170 $MgF_2$) (1.796 $TiO_2$) 9×(1 $MgF_2$ 1 $LaF_3$).

In this case, the numerical indications relate to the unit of Quarter Wave Optical Thickness (QWOT), that is to say to a quarter of the wavelength, at the used wavelength of 193 nm with virtually normal incidence. The exemplary embodiment concerning FIG. 8 therefore comprises an antireflection coating 7 in accordance with FIG. 7, a second reflective layer subsystem composed of two periods of layers 8c composed of $TiO_2$ and layers 8d composed of $MgF_2$ for the wavelength of 633 nm, a separating layer 8t composed of $TiO_2$ and a first layer subsystem composed of nine periods of layers 8b composed of $MgF_2$ and 8a composed of $LaF_3$ for the wavelength of 193 nm. Instead of a separating layer composed of $TiO_2$ between the first and second layer subsystems, layers composed of the materials $ZrO_2$, $Ta_2O_5$, $HfO_2$, Si, Ge, ZnS, $CuInSe_2$ or $CuInS_2$ could also have been chosen in this case. The separating layer serves to decouple the reflection properties of the first layer subsystem from the underlying layer subsystem by ensuring that as little light as possible having the used wavelength passes through the separating layer to the underlying layer subsystem. Furthermore, it is possible to provide an additional adhesion promoting layer between the antireflection coating 7 and the substrate 2 and/or between the antireflection coating 7 and the reflective coating 8 in the exemplary embodiment concerning FIG. 8.

The reflection properties of this exemplary embodiment outside the reflective surface 11 have already been discussed with reference to FIG. 7. The reflection properties within the reflective surface 11 of a micromirror 3 with a coating in accordance with the exemplary embodiment concerning FIG. 8 are discussed below with reference to FIGS. 9 and 10.

Figure 9:
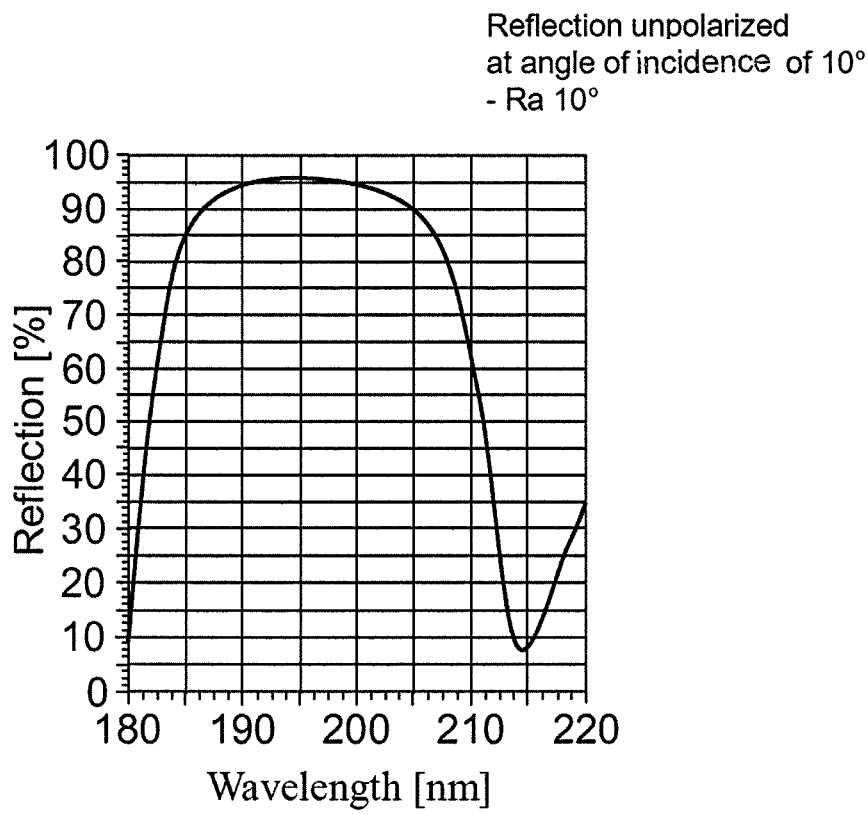

FIG. 9 shows an illustration of the reflectivity of the exemplary embodiment from FIG. 8 as a function of the wavelength in the vicinity of the used wavelength of 193 nm. It can be discerned with reference to FIG. 9 that the exemplary embodiment concerning FIG. 8 has a reflectivity of greater than 95% at the used wavelength of 193 nm given an angle of incidence of 10° relative to the normal to the reflective surface 11 of the micromirror 3. Furthermore, it can be discerned that the reflectivity is greater than 85% at a used wavelength of between 185 nm and 205 nm given an angle of incidence of 10° in this exemplary embodiment.

Figure 10:
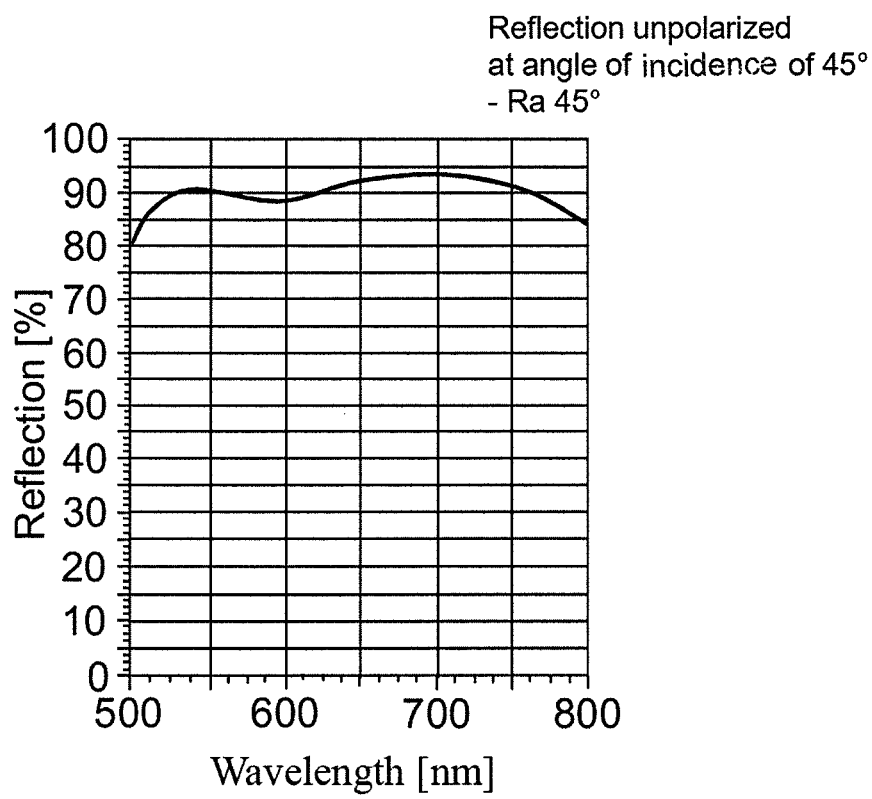
FIG. 10 shows an illustration of the reflectivity of the exemplary embodiment from FIG. 8 as a function of the measurement wavelength.

FIG. 10 shows an illustration of the reflectivity of the exemplary embodiment from FIG. 8 as a function of the wavelength in the vicinity of the measurement wavelength of 633 nm of the micromirror arrangement. It can be discerned with reference to FIG. 10 that the exemplary embodiment concerning FIG. 8 has a reflectivity of greater than 90% at the measurement wavelength of 633 nm given an angle of incidence of 45° relative to the normal to the reflective surface 11 of the micromirror 3. Furthermore, it can be discerned that the reflectivity of this exemplary embodiment at the same time as the reflectivity at the used wavelength, which is illustrated in FIG. 9, is more than 80% at a measurement wavelength of between 500 nm and 800 nm and given an angle of incidence of 45°. Consequently, the reflective coating 8, in particular the second layer subsystem, is designed in such a way that a reflectivity of more than 65%, in particular of more than 80%, results at a measurement wavelength deviating from the used wavelength, at an angle of incidence with respect to the normal to the reflective surface 11, wherein the angle of incidence deviates by more than 15°, in particular by more than 20°, from an angle of incidence of the used light, and wherein the angles of incidence of the used light are predetermined by the intended use of the micromirror arrangement.

The antireflection coating need not necessarily be applied on the top side of the mirror substrate 2, rather that, given a suitable geometry of the micromirror arrangement, the antireflection coating can also be applied to the rear side of the mirror substrate 2 or to an underlying substrate, which, if appropriate, likewise consists of silicon, as is explained in U.S. Pat. No. 6,891,655 B2 cited in the introduction, which, with regard to this aspect, is incorporated by reference in the content of this application.

The micromirror arrangement described above is suitable, in particular, for pupil shaping in illumination systems for microlithography which are operated at a wavelength of 193 nm. Furthermore, a plurality of micromirror arrangements can also be operated in parallel or successively in such illumination systems. The concepts described above, with suitable modifications, can also be used at other wavelengths, such as e.g. 248 nm. Furthermore the micromirror arrangement described above can also be used profitably in other optical apparatuses or in other fields of optics than microlithography. What is essential in this case is that the antireflection coating can be patterned by photolithography, for which reason, during patterning, only small tolerances occur and the antireflection coating can cover virtually the entire area outside the reflective surfaces, such that the "frame" of the individual micromirrors can be coated substantially completely with it.

Figure 11:
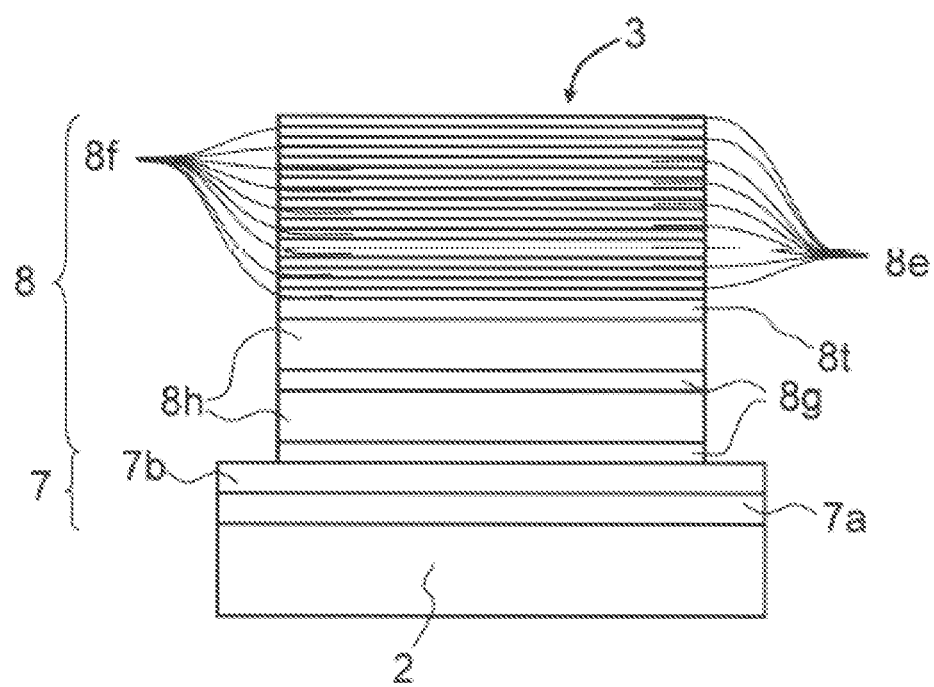

FIG. 11 is a schematic illustration of the layer construction according to the invention of the exemplary embodiments concerning the coating according to the invention of a micromirror 3 of the micromirror arrangement from FIG. 1a, which, besides the antireflection coating 7 having the layers 7a and 7b on a substrate 2, also concomitantly comprises the reflective coating 8. In this case, the reflective coating 8 consists of two layer subsystems, wherein the first layer subsystem has layers 8e, 8f composed of a periodic sequence of alternate high and low refractive index layers composed of a nonmetallic material and is optimized with regard to the reflectivity in respect of the used wavelength. The second layer subsystem consists of the high and low refractive index layers 8g, 8h and is optimized with regard to the reflectivity in respect of the measurement wavelength. The layer design for these exemplary embodiments can be specified by way of example as follows:

(Substrate) A×(7a, 7b) B×(8g, 8h) (8t) C×(8f, 8e), having A periods of the antireflection coating 7 consisting of the layers 7a and 7b, B periods of the first layer subsystem of the reflective coating 8 consisting of the layers 8g and 8h for the reflection of the measurement wavelength and C periods of the second layer subsystem of the reflective coating 8 consisting of the layers 8e and 8f for the reflection of the used wavelength.

The numbers A, B and C for the respective periods of the exemplary embodiments can in this case be between 1 and 20. The following materials are appropriate as material for the absorbent layer 7a: $TiO_2$, $Ta_2O_3$, $Ta_2O_5$, $HfO_2$, $ZrO_2$, chromium oxides ($Cr_xO_y$), $PbF_2$, $YF_3$, C, diamond-like carbon, Ge, Si, SiN, silicon nitrides ($Si_xN_y$), silicon oxide nitrides ($SiN_xO_y$) and non-stoichiometric silicon oxides ($Si_xO_y$). The following materials are appropriate as material for the further layer 7b of the antireflection coating 7: $SiO_2$, $MgF_2$, $LaF_3$, chiolite, cryolite, $Al_2O_3$ and $ErF_3$. For the layers 8g and 8h, materials are preferred which are selected from the group comprising: $La_2O_3$, $ZrO_2$, $TiO_2$, $Ta_2O_5$, $MgF_2$, $SiO_2$, $Al_2O_3$, Si, Ge, $HfO_2$, $AlF_3$. As material for the separating layer 8t, a material is suitable which is selected from the group comprising: $TiO_2$, $Ta_2O_5$, $HfO_2$, $ZrO_2$, Si, Ge, ZnS, $CuInSe_2$, $CuInS_2$, $La_2O_3$. For the layers 8e and 8f, materials are preferred which are selected from the group comprising: $LaF_3$, $MgF_2$, $SiO_2$, $Al_2O_3$, $ErF_3$, $GdF_3$, $HfO_2$, $AlF_3$. Furthermore, it is possible to provide an additional adhesion promoting layer between the antireflection coating 7 and the substrate 2 and/or between the antireflection coating 7 and the reflective coating 8 in the exemplary embodiments in accordance with FIG. 11. In this case, the thicknesses of the individual layers of the exemplary embodiments can be between half and a fifteenth of the unit Quarter Wave Optical Thickness (QWOT) at the used wavelength of 193 nm with virtually normal incidence.

The exemplary embodiment concerning FIG. 8 as set out above in this case constitutes only one possible specific exemplary embodiment from the multiplicity of exemplary embodiments according to the invention in FIG. 11, which result from the combinations of the lists of materials set out above and which are selected and optimized in terms of the choice of layer thicknesses to the effect that a highest possible reflectivity is achieved at the used wavelength and the measurement wavelength at the respective angle of incidence on the reflective surface 11 and a lowest possible reflectivity is achieved outside the reflective surface 11.

From this multiplicity of combinations, the exemplary embodiment in accordance with FIG. 8 is chosen in order to discuss the properties thereof by way of example with reference to FIGS. 7, 9 and 10. In this case, the exemplary embodiment concerning FIG. 8 specifically comprises the antireflection coating 7 in accordance with FIG. 7, a second reflective layer subsystem composed of two periods of layers 8g composed of $TiO_2$ and layers 8h composed of $MgF_2$ for the wavelength of 633 nm, a separating layer 8t composed of $TiO_2$ and a first layer subsystem composed of nine periods of layers 8f composed of $MgF_2$ and 8e composed of $LaF_3$ for the wavelength of 193 nm.

In this case, the present invention is not restricted to the exemplary embodiment in accordance with FIG. 8, but rather encompasses all exemplary embodiments which result from the possible combinations of materials such as are specified with regard to the figure description of FIG. 11 and which can be optimized with regard to the predetermined objective.

The present invention also encompasses aspects such as are presented in the form of the following formulations S1 to S34 on the basis of the exemplary embodiments in accordance with FIGS. 1a to 11. These formulations S1 to S34 are part of the present description:

S1: A micromirror arrangement 1, comprising:
at least one micromirror 3 having a reflective surface 11 formed at a mirror substrate 2, and a reflective coating 8 formed at the mirror substrate 2 within the reflective surface 11, characterized in that the reflective coating 8 has at least two layer subsystems, wherein the first layer subsystem has layers 8e and 8f composed of a periodic sequence of alternate high and low refractive index layers composed of a nonmetallic material and is optimized with regard to the reflectivity in respect of a used wavelength of the micromirror arrangement, and wherein the second layer subsystem is optimized with regard to the reflectivity in respect of a measurement wavelength of the micromirror arrangement, said measurement wavelength deviating from the used wavelength.

S2: Micromirror arrangement according to formulation S1, wherein the mirror substrate 2 consists of silicon and the reflective coating 8 is a patterned coating, wherein the patterning of the reflective coating 8 is given by the fact that the reflective coating 8 extends only within the reflective surface 11 of the micromirror 3.

S3: Micromirror arrangement according to formulation S1, wherein the reflective coating 8 has at least one separating layer 8t between the two layer subsystems, wherein the material of the separating layer 8t is a material selected from the group comprising: $TiO_2$, $Ta_2O_5$, $HfO_2$, $ZrO_2$, Si, Ge, ZnS, $CuInSe_2$, $CuInS_2$, $La_2O_3$.

S4: Micromirror arrangement according to any of the preceding formulations, wherein the materials of the layers 8e and 8f of the first layer subsystem are materials selected from the group comprising: $LaF_3$, $MgF_2$, $SiO_2$, $Al_2O_3$, $ErF_3$, $GdF_3$, $HfO_2$, $AlF_3$.

S5: Micromirror arrangement according to any of the preceding formulations, wherein the materials of the layers 8g and 8h of the second layer subsystem are materials selected from the group comprising: $La_2O_3$, $ZrO_2$, $TiO_2$, $Ta_2O_5$, $MgF_2$, $SiO_2$, $Al_2O_3$, Si, Ge, $HfO_2$, $AlF_3$.

S6: Micromirror arrangement according to any of the preceding formulations, wherein the at least one micromirror 3 has an antireflection coating 7 formed at the mirror substrate 2 outside the reflective surface 11,
characterized in that the antireflection coating 7 has at least one absorbent layer 7a composed of a nonmetallic material having an absorption coefficient of 0.1 or more, preferably of 0.2 or more, in particular of 0.4 or more, at a wavelength in the UV range, in particular at 193 nm.

S7: Micromirror arrangement according to formulation S6, wherein the material of the absorbent layer 7a is a material selected from the group comprising: $TiO_2$, $Ta_2O_3$, $Ta_2O_5$, $HfO_2$, $ZrO_2$, chromium oxides ($Cr_xO_y$), $PbF_2$, $YF_3$, C, diamond-like carbon, Ge, Si, SiN, silicon nitrides ($Si_xN_y$), silicon oxide nitrides ($SiN_xO_y$) and non-stoichiometric silicon oxides ($Si_xO_y$).

S8: Micromirror arrangement according to formulation S6, wherein at least one further layer 7b having a lower refractive index than the refractive index of the absorbent layer is applied to the absorbent layer 7a.

S9: Micromirror arrangement according to formulation S6, wherein the mirror substrate 2 consists of silicon and the antireflection coating 7 is a patterned coating, wherein the patterning of the antireflection coating 7 is at least given by the fact that the antireflection coating 7 extends only outside the reflective surface 11 of the micromirror 3.

S10: Micromirror arrangement according to formulation S6, wherein the antireflection coating 7 is formed at the mirror substrate 2 also within the reflective surface 11 and wherein the antireflection coating 7 and the reflective coating within the reflective surface 11 have a total stress of the coating of less than 100 N/m, in particular less than 30 N/m.

S11: Micromirror arrangement according to formulation S6, wherein the thickness of the at least one absorbent layer 7a is between 40 nm and 100 nm, preferably between 60 nm and 80 nm, and wherein the antireflection coating 7 has a reflectivity of 5% or less, preferably of 3% or less, in particular of 1% or less, at a used wavelength of 193 nm, or at a used wavelength of 248 nm, with normal incidence.

S12: Micromirror arrangement according to any of the preceding formulations, wherein the reflective coating 8, in particular the first layer subsystem, has a reflectivity of more than 65%, preferably more than 80%, in particular of more than 95%, at a used wavelength of 193 nm, or at a used wavelength of 248 nm, at an angle of incidence of between 0° and 25° with respect to the normal to the reflective surface 11.

S13: Micromirror arrangement according to any of the preceding formulations, wherein the reflective coating 8, in particular the second layer subsystem, is designed in such a way that a reflectivity of more than 65%, in particular of more than 80%, results at a measurement wavelength deviating from the used wavelength, at an angle of incidence with respect to the normal to the reflective surface 11, wherein the angle of incidence deviates by more than 15°, in particular by more than 20°, from an angle of incidence of the used light, and wherein the angles of incidence of the used light are predetermined by the intended use of the micromirror arrangement.

S14: Micromirror arrangement according to any of the preceding formulations, wherein the micromirror arrangement 1 has at least one adhesion promoting layer serving for promoting the adhesion of the reflective coating 8 on the antireflection coating 7 or for promoting the adhesion of the antireflection coating 7 on the substrate.

S15: A method for producing a coating for a micromirror arrangement 1, comprising: coating a mirror substrate 2 with an antireflection coating 7, and patterning the antireflection coating 7 by applying a material layer 9b that can be patterned by irradiation to the antireflection coating 9 and/or to the mirror substrate 2.

S16: Method according to formulation S15, wherein the mirror substrate 2 is coated with at least one absorbent layer 7a composed of a nonmetallic material having an absorption coefficient of 0.1 or more, preferably of 0.2 or more, in particular of 0.4 or more, at a wavelength in the UV range, in particular at 193 nm.

S17: Method according to formulation S16, wherein, as material of the absorbent layer 7a, a material is selected from the group comprising: $TiO_2$, $Ta_2O_3$, $Ta_2O_5$, $HfO_2$, $ZrO_2$, chromium oxides ($Cr_xO_y$), $PbF_2$, $YF_3$, C, diamond-like carbon, Ge, Si, SiN, silicon nitrides ($Si_xN_y$), silicon oxide nitrides ($SiN_xO_y$) and non-stoichiometric silicon oxides ($Si_xO_y$).

S18: Method according to formulation S16 or S17, wherein at least one further layer 7b having a lower refractive index than the refractive index of the absorbent layer 7a is applied to the absorbent layer 7a.

S19: Method according to any of formulations S15 to S18, further comprising: applying a reflective coating 8 to the antireflection coating 7 and/or to the mirror substrate 2 in order to produce at least one reflective surface 11 at a micromirror 3.

S20: Method according to formulation S19, wherein the reflective coating 8 is firstly applied areally and subsequently removed selectively from the antireflection coating outside the reflective surface 11.

S21: Method according to either of formulations S19 and S20, wherein the layer stress of the antireflection coating 7 is coordinated with the layer stress of the reflective coating 8 such that the two layer stresses substantially compensate for one another.

S22: Method according to any of formulations S15 to S21, wherein the antireflection coating 7 is firstly applied to the mirror substrate 2 areally and subsequently removed selectively from the mirror substrate 2 in the region of the reflective surface 11.

S23: Micromirror arrangement 1 comprising: at least one micromirror 3 having a reflective surface 11 formed at a mirror substrate 2, which preferably consists of silicon, and an antireflection coating 7 formed at the mirror substrate 2 outside the reflective surface 11, characterized in that the preferably patterned antireflection coating 7 has at least one absorbent layer 7a composed of a preferably nonmetallic material having an absorption coefficient of 0.1 or more, preferably of 0.2 or more, in particular of 0.4 or more, at a wavelength in the UV range, in particular at 193 nm.

S24: Micromirror arrangement according to formulation S23, wherein the material of the absorbent layer 7a is a silicon-nitrogen compound preferably selected from the group comprising: silicon nitrides ($Si_xN_y$) and silicon oxide nitrides ($SiN_xO_y$).

S25: Micromirror arrangement according to formulation S23 or S24, wherein at least one further layer 7b having a lower refractive index than the refractive index of the absorbent layer is applied to the absorbent layer 7a.

S26: Micromirror arrangement according to formulation S25, wherein the further layer 7b consists of a silicon-oxygen compound, in particular of silicon dioxide ($SiO_2$).

S27: Micromirror arrangement according to any of the preceding formulations S23 to S26, wherein all the layers 7a and 7b of the antireflection coating 7 consist of nonmetallic materials, in particular of silicon compounds.

S28: Micromirror arrangement according to any of the preceding formulations S23 to S27, wherein the thickness of the at least one absorbent layer 7a is chosen such that the radiation impinging on the absorbent layer 7a is completely absorbed.

S29: Micromirror arrangement according to formulation S28, wherein the thickness of the at least one absorbent layer 7a is between 40 nm and 100 nm, preferably between 60 nm and 80 nm.

S30: Micromirror arrangement according to any of the preceding formulations S23 to S29, wherein the antireflection coating 7 has a reflectivity of 5% or less, preferably of 3% or less, in particular of 1% or less, at a wavelength of 193 nm with normal incidence.

S31: Micromirror arrangement according to any of the preceding formulations S23 to S30, wherein the antireflection coating 7 has a reflectivity of 10% or less, preferably of 5% or less, at normal incidence in a wavelength range of between 185 nm and 210 nm, in particular up to 230 nm.

S32: Micromirror arrangement according to any of the preceding formulations S23 to S31, wherein the reflective surface 11 is formed at a reflective coating 8 which is preferably applied to the antireflection coating 7 and/or to the mirror substrate 2.

S33: Micromirror arrangement according to formulation S32, wherein the layer stress of the antireflection coating 7 substantially compensates for the layer stress of the reflective coating 8.

S34: Micromirror arrangement according to any of the preceding formulations S23 to S33, further comprising a supporting structure 5, on which the at least one micromirror 3 is mounted in movable fashion.

The above description of various embodiments has been given by way of example. From the disclosure given, those skilled in the art will not only understand the present invention and its attendant advantages, but will also find apparent various changes and modifications to the structures and method disclosed. The applicant seeks, therefore, to cover all such changes and modifications as fall within the spirit and scope of the invention, as defined by the appended claims, and equivalents thereof.

The invention claimed is:

1. A micromirror arrangement, comprising:
   at least one micromirror having a reflective surface formed at a mirror substrate, and
   a reflective coating formed at the mirror substrate within the reflective surface,
   wherein the reflective coating has at least two layer subsystems, wherein the first layer subsystem has layers composed of a periodic sequence of alternate high and low refractive index layers composed of nonmetallic materials and is optimized with regard to reflectivity in respect of a used wavelength of used light for the micromirror arrangement, wherein the second layer subsystem is optimized with regard to reflectivity in respect of a measurement wavelength of measurement light for the micromirror arrangement, wherein the measurement wavelength deviates from the used wavelength by at least 50 nm, and wherein an incidence angle of the used light on the reflection surface deviates from an incidence angle of the measurement light on the reflection surface by at least 15°.

2. The micromirror arrangement as claimed in claim 1, wherein the at least one micromirror has an antireflection coating formed at the mirror substrate outside the reflective surface,
   wherein the antireflection coating has at least one absorbent layer composed of a nonmetallic material having an absorption coefficient of 0.1 or more at an ultraviolet wavelength.

3. The micromirror arrangement as claimed in claim 2, wherein the material of the absorbent layer is a material selected from the group comprising: $TiO_2$, $Ta_2O_3$, $Ta_2O_5$, $HfO_2$, $ZrO_2$, chromium oxides ($Cr_xO_y$), $PbF_2$, $YF_3$, C, diamond-like carbon, Ge, Si, SiN, silicon nitrides ($Si_xN_y$), silicon oxide nitrides ($SiN_xO_y$) and non-stoichiometric silicon oxides ($Si_xO_y$).

4. The micromirror arrangement as claimed in claim 2, wherein a thickness of the at least one absorbent layer is between 40 nm and 100 nm, and wherein the antireflection coating has a reflectivity of 5% or less at a used wavelength of 193 nm, or at a used wavelength of 248 nm, with normal incidence.

5. The micromirror arrangement as claimed in claim 2, wherein the antireflection coating is formed at the mirror substrate also within the reflective surface and wherein the antireflection coating and the reflective coating within the reflective surface have a total stress of less than 100 N/m.

6. The micromirror arrangement as claimed in claim 2, further comprising at least one adhesion promoting layer promoting adhesion of the reflective coating on the antireflection coating or for promoting adhesion of the antireflection coating on the substrate.

7. The micromirror arrangement as claimed in claim 2, wherein at least one further layer is applied to the absorbent layer, and wherein the further layer is composed of $HfO_2$, $MgF_2$, $LaF_3$, chiolite, cryolite, $Al_2O_3$, $ErF_3$ or a silicon-oxygen compound.

8. The micromirror arrangement as claimed in claim 1, wherein the reflective coating has at least one separating layer between the two layer subsystems, and wherein the material of the separating layer is a material selected from the group comprising: $TiO_2$, $Ta_2O_5$, $HfO_2$, $ZrO_2$, Si, Ge, ZnS, $CuInSe_2$, $CuInS_2$, $La_2O_3$.

9. The micromirror arrangement as claimed in claim 1, wherein the materials of the layers of the first layer subsystem are materials selected from the group comprising: $LaF_3$, $MgF_2$, $SiO_2$, $Al_2O_3$, $ErF_3$, $GdF_3$, $HfO_2$, $AlF_3$.

10. The micromirror arrangement as claimed in claim 1, wherein the materials of the layers of the second layer subsystem are materials selected from the group comprising: $La_2O_3$, $ZrO_2$, $TiO_2$, $Ta_2O_5$, $MgF_2$, $SiO_2$, $Al_2O_3$, Si, Ge, $HfO_2$, $AlF_3$.

11. The micromirror arrangement as claimed in claim 1, wherein the reflective coating has a reflectivity of more than 65% at a used wavelength of 193 nm, or at a used wavelength of 248 nm, at an angle of incidence of between 0° and 25° with respect to the normal to the reflective surface.

12. The micromirror arrangement as claimed in claim 1, wherein the reflective coating is designed such that a reflectivity of more than 65% results at a measurement wavelength deviating from the used wavelength, at an angle of incidence with respect to the normal to the reflective surface, and wherein the angle of incidence deviates by more than 15° from an angle of incidence of the used light.

* * * * *